United States Patent [19]

Graves et al.

[11] Patent Number: 5,232,814
[45] Date of Patent: Aug. 3, 1993

[54] PRESENSITIZED COLOR-PROOFING SHEET

[75] Inventors: Charles W. Graves, Lake Elmo; Timothy W. Olson, Shoreview, both of Minn.

[73] Assignee: Minnesota Mining and Manufacturing Company, St. Paul, Minn.

[21] Appl. No.: 814,435

[22] Filed: Dec. 30, 1991

[51] Int. Cl.$^5$ ................................................ G03C 1/60
[52] U.S. Cl. ...................... 430/158; 430/143; 430/293; 430/156; 430/259
[58] Field of Search ............... 430/143, 158, 293, 358, 430/156, 259

[56] References Cited

U.S. PATENT DOCUMENTS

| | | | |
|---|---|---|---|
| 3,211,553 | 10/1965 | Ito | 430/161 |
| 3,671,236 | 6/1972 | Ven Beusekom | 430/143 |
| 3,721,557 | 3/1973 | Inoue | 430/293 |
| 4,250,242 | 2/1981 | Doering | 430/141 |
| 4,260,673 | 4/1981 | Krech | 430/143 |
| 4,482,625 | 11/1984 | Namiki et al. | 430/143 |
| 4,564,571 | 1/1986 | Masaki | 430/15 |
| 4,666,817 | 5/1987 | Sachi | 430/160 |
| 4,705,739 | 11/1987 | Fisch | 430/276 |
| 4,783,390 | 11/1988 | Mino et al. | 430/156 |
| 4,914,039 | 4/1990 | Wanat | 430/143 |
| 5,001,037 | 3/1991 | Matthews et al. | 430/291 |
| 5,100,757 | 3/1992 | Platzer et al. | 430/143 |

*Primary Examiner*—Charles L. Bowers, Jr.
*Assistant Examiner*—John A. McPherson
*Attorney, Agent, or Firm*—Gary L. Griswold; Walter N. Kirn; Mark A. Litman

[57] ABSTRACT

Metallic appearing images may be produced with a color proofing sheet which comprises a temporary carrier layer, a metallic appearance pigment-filled layer, a color pigment filled layer, a photoresist layer, and an optional adhesive layer. There may be a barrier layer between the optional adhesive and the resist layer and a release layer coating may be on the temporary carrier layer.

32 Claims, No Drawings

PRESENSITIZED COLOR-PROOFING SHEET

BACKGROUND OF THE INVENTION

1 Field Of The Invention

The present invention relates to sensitive elements for the photomechanical production of multi-color images without printing. The invention has particular relevance to production of color proofs in which at least one color is metallic in appearance. The invention is applicable to both overlay and surprint proofs in either the positive or negative acting modes.

2. Background of the Art

In printing pictorial matter, whether by lithography, letterpress or gravure, the half tone process is generally used, wherein the actual printing image is composed of thousands of minute dots per square inch of a single color ink of varied dot size or ink density. What the naked eye sees as shading in half tone prints is actually the controlled variation in the size of the dots relative to the unprinted areas between the dots. In black and white pictorial matter the dots are printed in black ink only. Full color reproductions, however, are necessarily printed in each of at least three colors, cyan, magenta, and yellow (known as "three color process"), on in these same colors with the addition of black ("four color process"). For each color a separate printing plate is made. In order to make the three or four printing plates, the original color picture or photograph is "separated" either photographically with a camera using filters, masks, etc. or electronically with a color scanner, each separation or individual color information source representing one of the colors, and containing, dot for dot, the amount of that color which must be printed to produce the desired total color print. The preparation of the color-separations and individual color information source is an art and requires considerable skill in handling many variables to produce a desired result. Often trial and error is involved, requiring correction or replacement of one or more of the separations or color sources. Unless some reliable system is available to "proof" the separations or color sources, the printing press must be set up and copy printed just to secure preliminary proofs. This is time consuming and expensive. It is therefore desirable to provide accurate means for proofing the separations or electronically stored color sources without printing.

There are four types of color proofs, a) overlay negative acting, b) overlay positive acting, c) surprint negative acting, and d) surprint positive acting. U.S. Pat. No. 3,136,637 discloses type a) proofing. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas (e.g. between halftone dots). After they are assembled together in registry on a white background, a color proof results.

U.S. Pat. No's. 4,250,242 and 3,211,553 describe a positive acting overlay proofing material (type b) above) in which separation positive films are used. In this case the imaged (exposed) areas are removed on processing to yield similar halftone color images which may be assembled together in registry on a white background to give a color proof.

U.S. Pat. No. 3,671,236 describes a negative acting surprint proofing material (type c) above) in which photo-mechanically produced images corresponding with each color are integrally built up on a single substrate (much as occurs in the actual printing operation itself) without any printing operations. The multiplicity of carrier films is eliminated by transferring individual color images from a sheet comprised of (1) a carrier with release surface, (2) pigment and binder layer, (3) photohardenable or insolubilizable layer, (4) barrier layer and (5) pressure-sensitive adhesive layer.

Similarly U.S. Pat. No. 4,260,673 describes a positive acting surprint proofing material (type d) above) in which a positive acting diazo oxide photosensitive layer is used. The color proofing sheet is comprised of a color layer, a binder layer, both being light sensitive, and non-light sensitive solvent resistant barrier layer with the binder layer being present to provide a means of eliminating residual toning between adjacent layers in the structure. This layer may also act as a thermal, adhesive layer to transfer individual color images to a single support forming a surprint proof.

BRIEF DESCRIPTION OF THE INVENTION

The present invention describes photomechanical proofing media which are capable of providing proofing images on non-standard colors, and in particular are able to provide proofing images of metallic appearance images. The proofing media may be positive or negative imaging materials and may be for transfer, surlay or overlay systems. The unifying characteristic of the invention is that the photosensitive media be resist imageable (including peal-apart or strippable imaging) and contain two distinct pigment containing layers. The two pigment containing layers comprise a first layer of a metallic appearing pigment in a binder and a second layer comprising a non-metallic visible color pigment in a binder.

In negative-acting imaging systems the pigment layers may be distinct from a photosensitive layer, or one or both of the pigment layers may be photosensitive negative-acting layers.

In positive-acting imaging systems of the photosolubilization type imaging systems, each pigment layer should contain a photosolubilizer such as a diazo oxide.

For the surprint proofing materials, the media or photosensitive article comprises at least a) a carrier layer with a release surface, b) a metallic appearance pigment and binder layer, c) a color pigment and binder layer, d) optionally a photohardenable layer, and e) a laminable adhesive layer. It is preferred to have an organic solvent soluble barrier layer between the adhesive layer and the rest of the construction. It is also preferred to have a release layer coating on the carrier layer to provide the release surface. For the overlay proofing materials, the release, barrier, and adhesive layers are not required.

The present invention can be used as an overlay for any image, only requiring registration with that image. It can be used with any surprint system with suitable variation in the adhesive used and pressure used in the lamination to that surprint system.

DETAILED DESCRIPTION OF THE INVENTION

The metallic appearing proofing elements of the present invention differ from the above-described proofing media of the prior (as represented by U.S. Pat. No.

3,136,637, U.S. Pat. No. 4,250,242, U.S. Pat. No. 3,671,236, and U.S. Pat. No. 4,260,673) and is different in a number of ways. The most obvious difference is that the prior art proofing media has a single color containing layer therein. That color layer may be the same layer or a different layer than that which is photosensitive, but there is only one layer which is intended to contribute color to the proofing image. In the present invention, there must be two layers with easily visually observable concentrations of pigments therein (reflectance optical densities of at least 0.1, preferably at least 0.2). Both the non-metallic color layer, underneath and adjacent with the metallic color layer, and the metallic-appearing color layer have sufficient concentrations of pigments to be visible. The first color layer is referred to as a "flat" color layer. Even though it may be the same color as conventional color proofing layers (cyan, yellow, magenta, or black), it may be other colors as well. The color is chosen to enhance the metallic hue of the metallic layer. The flat color layer is color formulated in hue, chroma, and lightness to closely match the desired metallic target color. This is important because it is far more difficult to find precisely matching metallic pigments than it is to appropriately adjust the color balance of pigments.

The metallic pigments are commercially available in a variety of colors and forms. It is difficult to use actual metal flakes or particles because of their difficulty in forming even dispersions or suspensions. It is therefore preferred to use particles, such as mica, which are coated with metal or metal oxide. These are also commercially available (e.g. Merlin (TM) Luster Pigments, The Mearl Corporation, N.Y.). Pigments available include at least brass, gold, bronze, silver, copper, russet, and variations of these colors. The particles in the metallic layers vary from about 1 to 100 microns in their average largest dimension.

For the negative acting surprint article of the present invention the thermally laminable adhesive layer preferably has the following properties provided by the thermal adhesive layer:

(1) the adhesive layer be thermally laminable at a temperature between 100° and 150° C. at a pressure of 1.6 lb/in$^2$(0.29 kg/cm$^2$),
(2) the adhesive layer is non-tacky at room temperature or preferably not laminable to paper or shelf-laminable at 45° C., 2 g/cm$^2$, for at least one week,
(3) will not discolor or alter its optical density by more than 0.05 optical density units when an area of 15,000 cm$^2$ is exposed to a 5 kilowatt source of ultraviolet radiation having a majority of the radiation distributed over the range of 350 and 450 nm, at a distance of 1 meter for 2 minutes, and
(4) have no ingredients which by themselves or in combination with the solvent of the adhesive layer migrate across the barrier layer and desensitize the photohardenable layer, alter the color or tone of the pigments, or alter the optical qualities of the barrier or photosensitive layer.

The adhesive layer must also strongly adhere to the barrier layer, the bond strength between those layers exceeding the mild bond strength between the release layer and either the pigment containing binder layer or the carrier layer.

The property described above for non-coloration reflects conditions of conventional imagewise exposure for this article. Thus the element should not discolor or alter its optical density by as much as 0.05 optical density units (at any wavelength) when subjected to the conventional levels of exposure required to image the diazo resin. Exposure at 380-420 nm is conventional in industry at present (that is, an exposing radiation having a peak output surrounding 380-420 nm is acceptable). The sheet should not visibly discolor when exposed to sufficient radiation to enable an image to be developed from activation of the diazo resin.

For the positive acting surprint article of the present invention the thermally laminable adhesive layer should have the properties found in U.S. Pat. No. 4,260,673. Pressure sensitive adhesives of U.S. Pat. No. 3,671,236 (negative acting) and U.S. Pat. No. 4,260,673 (positive acting) may be used in place of the thermal adhesives with properly adjusted lamination conditions as described in the respective patents.

The construction for either of the surprint proof articles would typically comprise a carrier sheet provided with a release surface, which may either be a smooth surface of the carrier itself, or a surface coating thereon. Overlying the surface and in intimate clinging engagement therewith, but not adhesively bonded thereto, is a metallic appearing pigment in a solvent softenable (dispersible or soluble) polymeric binder. Over the metallic appearing layer is a color coating comprising, for example, a pigmented organophilic water-insoluble solvent-softenable resinous polymer. In the positive acting embodiment both the metallic appearing layer and the color layer are photosensitized using diazo-oxide compounds. In the negative acting embodiment an additional layer is coated over (and in contact with the non-metallic color-coating) consisting of a light-sensitive diazo resin. The color coating and light sensitive layer are intimately associated and adherently bonded together (and in certain constructions can actually be combined to a single layer). This negatively acting light-sensitive layer is soluble in the solution which softens and/or partially dissolves the color coating. Overlying either the color layer of the positive system or the diazo layer of the negative system is preferably a continuous solvent-resistant resinous protective film or barrier layer. To the exposed surface of the barrier layer is applied a layer of thermally laminable adhesive. Preferably the adhesive layer is from $0.1 \times 10^{-4}$ cm to $20 \times 10^{-4}$ cm in thickness. The outer surface of the adhesive can optionally be protected from contamination by dirt or grease, by a protective release liner.

In applying either the positive or negative surprint material to a substrate, such as white paper, if present the protective liner is first stripped from the adhesive surface and the entire structure is laminated for example, by heated rolling, onto the substrate. Thereafter, the carrier sheet is stripped from the structure, the bond to the paper and the adhesion between the several layers being greater than the non-adhesive clinging engagement between the carrier sheet and the color coating or the release layer. Following the removal of the carrier, the remaining structure, now bonded to the substrate, is exposed to ultraviolet light (or to whatever radiation the photosensitive layer has been sensitized) through the appropriate color separation corresponding with the color of the particular coating. In the light struck areas, the ultraviolet light passes through the color coating (which is transparent thereto) and exposes the light-sensitive material. Adjacent unexposed areas remain light-sensitive.

Thereafter the sheet is processed with processing solvent selected with respect to the particular material of which the color coating layer is composed to develop the image. The color coating and the metallic appearing coating remain in the exposed areas of the negative acting materials and are removed in the exposed areas of the positive acting materials, leaving the color image anchored to the underlying support layers. During processing, the barrier layer serves as a barrier which protects the substrate (and adhesive) from solutions used during the processing.

In the negative surprint materials, the preferred adhesive system of the present invention has been found to be limited to a narrow class of available thermal adhesives, as described in U.S. Pat. No. 4,656,114. For the positive surprint materials, the preferred adhesive system of the present invention is described in U.S. Pat. No. 4,260,673.

Following or preceding the above described photomechanical production of a color image on the substrate, for example cyan, similar sheets but containing the yellow, magenta, black, and metallic color coatings are successively applied to yield a multiple color proof.

These and other aspects of the invention will now be illustrated in the following non-limiting examples:

EXAMPLE 1

Negative Acting and Surprint Material—Gold Metallic

A carrier sheet of a 51 micrometer film of biaxially oriented polyethylene terephthalate polyester was first coated with an aqueous solution constituted as follows:

| PVA RELEASE LAYER | PARTS BY WEIGHT |
|---|---|
| Water | 95.66 |
| Polyvinyl alcohol (Airvol TM 205 from Air Products and Chemicals) | 2.55 |
| Polyvinyl alcohol (Airvol TM 540 from Air Products and Chemicals) | 0.85 |
| Octyl phenoxy polyethoxy ethanl (Triton X-100, 10% in water from Rohm and Haas) | .94 |

A dry coating weight of 0.75 grams/meter$^2$ provided a satisfactory release layer. This dried release layer was coated with the following composition:

| METALLIC PIGMENT LAYER | PARTS BY WEIGHT |
|---|---|
| 1,1,2 Trichloroethane | 91.5 |
| Polyvinyl formal (Formvar 15/95E Resin from Monsanto Chemical) | 1.5 |
| Brilliant Gold Pigment (The Mearl Corporation) | 1.5 |
| Methyl Ethyl Ketone | 5.5 |

The dried coating weight of this layer was 1.2 grams/meter$^2$. A second pigmented layer of the following composition was coated over the first pigmented layer above:

| FLAT PIGMENT LAYER | PARTS BY WEIGHT |
|---|---|
| 1,1,2 Trichloroethane | 92.4 |
| Formvar 15/95E Resin from Monsanto Chemical | 0.67 |
| Opaque Yellow Chips (50/50 blend of pigment and Formvar (5/95E) | 0.25 |
| Regal 300R carbon black from Cabot (50/50 blend of pigment and Formvar 15/95E) | 0.39 |
| Radient Red Chips (50/50 blend of pigment and Formvar 15/95E) | 0.01 |
| Methyl Ethyl Ketone | 4.00 |

The dried coating weight of this layer was 0.35 grams/meter$^2$. Supracoated on this layer was coated the following photosensitizer layer:

| PHOTOSENSITIVE LAYER | PARTS BY WEIGHT |
|---|---|
| Water | 98.95 |
| Citric acid | 0.05 |
| Boric acid | 0.05 |
| thiourea | 0.17 |
| Diazo Resin (p-diazodiphenylamine-formaldehyde resin - Jewett and Case U.S. Pat. No. 2,714,066) | 0.62 |
| Surfactant BL-240 (General Electric Co.) | 0.02 |
| Triton X-100 (10% solution in water) | 0.14 |

The dried coating weight of this layer was 0.074 grams/meter$^2$. This layer was in turn supracoated with a barrier layer of the following composition:

| BARRIER LAYER | PARTS BY WEIGHT |
|---|---|
| Methyl Ethyl Ketone | 91.00 |
| Vinyl Chloride/Vinyl Acetate/Vinyl Alcohol (Vinylite VAGH Resin from Union Carbide) | 2.25 |
| Polymethyl Methacrylate (Lucite 2044 Acrylic Resin from DuPont) | 6.75 |

The dried coating weight of this layer was 2.0 grams/meter$^2$. The final layer of adhesive was supracoated over the above barrier layer to a dried coating weight of 5.0 gm/m$^2$ the adhesive layer having the following composition:

| ADHESIVE LAYER | PARTS BY WEIGHT |
|---|---|
| Polymethyl methacrylate beads (8% by weight in water) - PMMA Beads MA-6 (3M Fine Chemical Manufacfacturing Division, Rochester, New York) | 1.87 |
| Water | 47.10 |
| Potassium Hydroxide | 0.08 |
| Hycar 26315 Latex - 49.5% Solids from B. F. Goodrich | 40.39 |
| Hycar 26106 Latex - 49.5% Solids from B. F. Goodrich | 10.10 |
| Acrysol ASE-95 - 18% Solids from Rohm and Haas | 0.46 |

In use this layered composition is laminated with the adhesive layer adjacent to the final support which may be any of the following:
1. Four color proof as described in U.S. Pat. No. 4,656,114.
2. Color proofs such as CHROMALIN TM by DuPont.
3. Paper or paper like supports of any color including black or white.
4. Color proofs in which additional color layers may be over laminated.

After lamination, the resultant material is placed under an appropriate mask and exposed and processed as described in U.S. Pat. No. 4,656,114. The result is an image corresponding with the mask used in the exposure and which has a metallic golden appearance.

EXAMPLE 2

Negative Acting Surprint Material—Silver Metallic

The layers are coated as in example 1 with the following exceptions:

| METALLIC LAYER | PARTS BY WEIGHT |
| --- | --- |
| 1,1,2 Trichloroethane | 91.5 |
| Formvar 15/95E Resin | 1.5 |
| Satin White Pigment | 1.5 |
| Methyl Ethyl Ketone | 5.5 |

Coated to a dry coating weight of 1.2 grams/meter$^2$.

| FLAT PIGMENT LAYER | PARTS BY WEIGHT |
| --- | --- |
| 1,1,2 Trichloroethane | 96.05 |
| Formvar 15/95E Resin | 0.56 |
| Regal 300R carbon black from Cabot (50/50 blend of pigment and Formvar 15/95E) | 0.35 |
| Opaque Yellow chips (50/50 blend of pigment and Formvar 15/95E) | 0.35 |
| Radiant Red Chips (50/50 blend of pigment and Formvar 15/95E) | 0.34 |
| Red Shade Cyan Chips (50/50 blend of pigment and Formvar 15/95E) | 0.39 |
| Methyl Ethyl Ketone | 1.96 |

Coated to a dry coating weight of 0.35 grams/meter$^2$.

The PVA, Photosensitive, Barrier, Adhesive layers are the same as in example 1. This material, when laminated, exposed and processed as in example 1, gives a metallic silver image.

EXAMPLE 3

Negative Acting Overlay Material—Gold Metallic

An overlay proofing material for metallic appearing images may be prepared as follows:

A carrier sheet of a 51 micrometer film of biaxially oriented polyethylene terephthalate polyester was first coated with an aqueous solution constituted as follows:

| PHOTOSENSITIVE LAYER | PARTS BY WEIGHT |
| --- | --- |
| Wate | 98.95 |
| Citric acid | 0.05 |
| Boric acid | 0.05 |
| Thiourea | 0.17 |
| Diazo Resin (p-diazodiphenylamine-formaldehyde resin U.S. Pat. No. 2,714,066) | 0.62 |
| Surfactant BL-240 (General Electric Co.) | 0.02 |
| Triton TM X-100 (10% solution in water) | 0.14 |

The dried coating weight of this layer was 0.074 grams/meter$^2$. This layer was in turn supracoated with a pigmented dispersion of the following composition:

| FLAT PIGMENT LAYER | PARTS BY WEIGHT |
| --- | --- |
| 1,1,2 Trichloroethane | 92.4 |
| Formvar TM 15/95E Polyvinyl butyral Resin from Monsanto Chemical | 0.67 |
| Opaque Yellow Chips (50/50 blend of pigment and Formvar 15/95E | 0.25 |
| Regal 300R carbon black from Cabot (50/50 blend of pigment and Formvar 15/95E | 0.39 |
| Radient Red Chips (50/50 blend of pigment and Formvar 15/95E | 0.01 |
| Methyl Ethyl Ketone | 4.00 |

The dried coating weight of this layer was 0.35 grams/meter$^2$. A third layer is added which contains the metallic pigment.

| METALLIC PIGMENT LAYER | PARTS BY WEIGHT |
| --- | --- |
| 1,1,2 Trichloroethane | 91.5 |
| Polyvinyl formal (Formvar 15/95E Resin from Monsanto Chemical | 1.5 |
| Brilliant Gold Pigment (The Mearl Corporation) | 1.5 |
| Methyl Ethyl Ketone | 5.5 |

The dried coating weight of this layer was 1.2 grams/meter$^2$. A metallic image was prepared according to U.S. Pat. No. 3,136,637 by contact exposure to a mask followed by development in n-propanol-water in a 1:1 volume ratio. This image may be overlayed either over a composite multicolor image such as a surprint proof or over an overlay proof as described in U.S. Pat. No. 3,136,637.

EXAMPLE 4

Negative Acting Surprint Material—Gold Metallic, Control—One Layer Metallic Pigment Construction A carrier sheet of a 51 micrometer film of biaxially oriented polyethylene terephthalate polyester was first coated with an aqueous solution constituted as follows:

| PVA RELEASE LAYER | PARTS BY WEIGHT |
| --- | --- |
| Water | 95.66 |
| Polyvinyl alcohol (Airvol TM 205 from Air Products and Chemicals) | 2.55 |
| Polyvinyl alcohol (Airvol TM 540 from Air Products and Chemicals) | 0.85 |
| Octyl phenoxy polyethoxy ethanol (Triton X-100, 10% in water from Rohm and Haas) | .94 |

A dry coating weight of 0.75 grams/meter$^2$ provided a satisfactory release layer. This dried release layer was coated with the following composition:

| METALLIC PIGMENT LAYER | PARTS BY WEIGHT |
| --- | --- |
| 1,1,2 Trichloroethane | 91.5 |
| Polyvinyl formal (Formvar TM 15/95E Polyvinyl butyral resin from Monsanto Chemical) | 1.5 |
| Brilliant Gold Pigment (The Mearl Corporation) | 1.5 |
| Methyl Ethyl Ketone | 5.5 |

The dried coating weight of this layer was 1.68 grams/meter$^2$. Supracoated on this layer was coated the following photosensitizer layer:

| PHOTOSENSITIVE LAYER | PARTS BY WEIGHT |
|---|---|
| Water | 98.95 |
| Citric acid | 0.05 |
| Boric acid | 0.05 |
| Thiourea | 0.17 |
| Diazo Resin (p-diazodiphenylamine-formaldehyde resin, U.S. Pat. No. 2,714,066) | 0.62 |
| Surfactant BL-240 (General Electric Co.) | 0.02 |
| Triton X-100 (10% solution in water) | 0.14 |

The dried coating weight of this layer was 0.074 grams/meter$^2$. This layer was in turn supracoated with a barrier layer of the following composition:

| BARRIER LAYER | PARTS BY WEIGHT |
|---|---|
| Methyl Ethyl Ketone | 91.00 |
| Vinyl Chloride/Vinyl Acetate/Vinyl Alcohol (Vinylite TM AVGH Resin from Union Carbide) | 2.25 |
| Polymethyl Methacrylate (Lucite TM 2044 Acrylic Resin from DuPont) | 6.75 |

The dried coating weight of this layer was 2.0 grams/meter$^2$. The final layer of adhesive was supracoated over the above barrier layer having the following composition:

| ADHESIVE LAYER | PARTS BY WEIGHT |
|---|---|
| Polymethyl methacrylate beads with a narrow size distribution range (8% by weight in water) - PMMA Beads MA-6 (3M Fine Chemical Manufacturing Division, Rochester, New York) | 1.87 |
| Wate | 47.10 |
| Potassium Hydroxide | 0.08 |
| Hycar TM 26315 Latex - 49.5% Solids from B. F. Goodrich | 40.39 |
| Hycar TM 26106 Latex - 49.5% Solids from B. F. Goodrich | 10.10 |
| Acrysol TM ASE-95 - 18% Solids from Rohm and Haas | 0.46 |

In use this layered composition is laminated with the adhesive layer adjacent to the final support, a four color proof as described in Cederberg and Musser U.S. Pat. No. 4,656,114.

After lamination, the resultant material is placed under an appropriate mask and exposed and processed as described in U.S. Pat. No. 4,656,114. The resulting image has an unacceptable high background as the entire metallic layer was not removed during processing and in the exposed areas, the underlying images were visible. This material containing one thick layer of metallic pigment did not produce acceptable images.

EXAMPLE 5

Positive Acting Surprint Material—

The article construction had the following layers in the indicated order:

Starting with a 51 micrometer polyethylene terephthalate temporary support, the following layers are coated in the order given:

1. PVA Release Layer

Coated to a dry coating weight of 0.75 grams/meter square for layer 1 on the polyester base.

| | PARTS BY WEIGHT |
|---|---|
| Water | 96 |
| Polyvinyl alcohol - Airvol TM 205 from Air Products and Chemicals | 2.03 |
| Polyvonyl alcohol - Airvol TM 540 from Air Products and Chemicals | .67 |
| Octyl phenoxy polyethoxy ethanol - | 1.30 |
| Triton TM x-100 from Rohm and Haas, 10% in water | 1.30 |

2. Metallic Color Layer

First prepare the following Urethane reaction product solution as described in U.S. Pat. No. 4,260,673, example 1:

| | PARTS BY WEIGHT |
|---|---|
| Novalak type phenolic resin (Resinox RS 7280 from Monsanto Co. of St. Louis, Mo.) | 40.82 |
| 1,3,5 Tris(dimethylaminomethyl)phenol | 2.03 |
| Diisocyanate D.D.I. 1410 from Henkel | 3.31 |
| Methylethylketone | 53.84 |

The following mixture was prepared then coated over the PVA layer from step 1 to a dry coating weight of 0.46 grams/meter square for layer 2.

| | PARTS BY WEIGHT |
|---|---|
| Urethane reaction product solution above | 89.15 |
| Polyvinylbutyral resin - Butvar TM B-76 from Monsanto | 1.75 |
| Affair 111 pigment from EMI Industries, Hawthorne, N.Y. | 7.1 |
| Napthoquinone-(1,2)-diazido-(2)-5-sulfo-acid ester of 4-tertiarybutyl-phenol | 2.0 |

3. Flat Color Layer

A Cyan pigment dispersion was prepared as follows:

| | PARTS BY WEIGHT |
|---|---|
| Urethane reaction product solution | 97.13 |
| Polyvinylbutyral resin - Butvar B76 from Monsanto | .78 |
| Cyan pigment - C.I. Pigment 15:3 from Sun Chemical | 3.09 |

Coat the material from step 2. above to a dry coating weight of 0.62 grams/ meter square for layer 3.

| | PARTS BY WEIGHT |
|---|---|
| Cyan pigment dispersion | 50.0 |
| 2 diazo-1-napthol,5-sulfonic acid diester of 2,4-dihydroxybenzophenone | 2.0 |
| Methylethylketone | 48.0 |

4. Adhesive Layer

Coated to a dry coating weight of 5.6 grams/meter square for layer 4.

| | PARTS BY WEIGHT |
|---|---|
| Toluene | 87.5 |
| Styrene Butadiene polymer - Pliolite S-5A from Goodyear | 7.5 |

-continued

| | PARTS BY WEIGHT |
|---|---|
| 2-Propenoic acid, 2-ethylhexyl ester - Pliolite AC from Goodyear | 5.0 |

The above construction was exposed and processed according to U.S. Pat. No. 4,260,673 to give an image with a silvery metallic appearance.

EXAMPLE 6

Positive Acting Overlay Material—

An overlay positive proofing material for metallic appearing images may be prepared as follows: A support sheet of polyester was coated with the following layers given in example 5 in the order given: Flat Color Layer, Metallic Color Layer. The resulting material may be exposed in contact with a positive separation film and then processed to give an overlay metallic image. This image then can either be placed in register with a multicolor overlay proof or can be placed over a surprint proof or can be placed over any image to provide a proof of the effect of printing this metallic image via lithography for example.

In the surprint proofing materials, certain necessary relationships exist between the elements of the constructions just described. Adhesive relationships must be such that, after adhesive lamination to the backing sheet, the release layer will allow stripping away the carrier layer without disrupting the adhesive bond. Failure must not occur at either the adhesive-backing sheet or adhesive-barrier layer bonds. While it is not particularly critical whether release occurs between carrier-layer - release-layer or release-layer-color-layer, release is generally less efficient between two in situ formed layers, resulting in somewhat more likely release between carrier layer and release layer. In this event, it is of importance that the release layer be transparent and soluble in the developing solution.

The bonds formed between the adhesive layer and the photosensitive layer, if any, and the color layer and the metallic layer (or any intermixing occurring at the interfaces) must not be such as to prevent the flat color-coat or the metallic color-coat from being removed in the appropriate areas during development. It has been found that the desired relation is present where at least a degree of physical incompatibility exists between the resins comprising the flat color layer and barrier layers.

During the coating operations, best results are obtained where a later applied layer is cast from a solvent which does not dissolve prior layers.

In examples 1, 2, and 3, the flat color coating and the diazo resin were applied in separate steps from different solvents.

We claim:

1. A photosensitive color-proofing sheet which is photoresist imageable comprising a support layer and two pigment layers, one pigment layer comprising an organic solvent soluble polymeric binder and a metallic appearing pigment and a second pigment layer comprising an organic solvent soluble polymeric binder and a visible color pigment, photosensitivity of the sheet being contributed to by at least one of said pigment layer or by a distinct photosensitive layer, said one pigment layer and said second pigment layer being removable by one solvent solution.

2. The sheet of claim 1 wherein said sheet is a positive-acting photoresist imageable sheet.

3. The sheet of claim 2 wherein each of said two pigment layers contains a photosolubilizer.

4. The sheet of claim 3 wherein said photosolubilizer comprises a diazo oxide.

5. The sheet of claim 3 wherein the order of layers within said sheet comprises:
   a) support layer,
   b) metallic appearing pigment layer,
   c) visible color pigment layer, and
   d) adhesive layer.

6. The sheet of claim 4 wherein the order of layers within said sheet comprises:
   a) support layer,
   b) metallic appearing pigment layer,
   c) visible color pigment layer, and
   d) adhesive layer.

7. The sheet of claim 5 wherein a barrier layer is in between said adhesive layer and visible color pigment layer.

8. The sheet of claim 7 wherein a release layer is between said support layer and said metallic appearing pigment layer.

9. A presensitized color-proofing sheet comprising a carrier sheet having a release surface, a first pigment layer comprising a continuous layer of hydrophobic water-insoluble resinous polymer softenable or partially dissolvable in a solvent developing medium and a pigment which provides a metallic appearance to this first pigment layer, a second pigment layer comprising a continuous color coating of pigmented organophilic hydrophobic water-insoluble resinous polymer softenable and/or partially dissolvable in the same solvent developing medium as said first pigment layer, said color coating being in intimate clinging engagement with but not adhesively bonded to said release surface, and a light-sensitive diazo resin soluble in said solvent developing medium directly associated with said color coating, said direct association being at least one of the following:

(a) the incorporation of said diazo resin in the color coating to form a single layer; and
   (b) the incorporation of said diazo resin in a layer separate but contiguous to the color coating layer, and over a layer containing said diazo resin, a thermally-laminable adhesive layer bonded to said layer containing said diazo resin.

10. The presensitized sheet of claim 1 wherein said color coating comprises a pigmented polyvinyl formal resin.

11. The presensitized sheet of claim 9 wherein there is a continuous, water-insoluble, transparent, colorless barrier layer bonded to a layer comprising diazo resin, and said diazo resin becomes insoluble and firmly bonds said color layer to said barrier layer in the light-struck areas upon light exposure of said sheet, the color layer and diazo resin being readily removable from said barrier layer in areas not light exposed and over said barrier layer.

12. The presensitized sheet of claim 10 wherein there is a continuous, water-insoluble, transparent, colorless barrier layer bonded to a layer comprising diazo resin, and said diazo resin becomes insoluble and firmly bonds said color layer to said barrier layer in the light-struck areas upon light exposure of said sheet, the color layer and diazo resin being readily removable from said barrier layer in areas not light exposed and over said barrier layer.

13. The presensitized sheet of claim 9 wherein said thermally-laminable adhesive layer comprises a layer of at least one acrylic polymer or copolymer which is laminable at a temperature between 100° and 150° C. at a pressure of 0.29 kg/cm$^2$ in 10 seconds, non-tacky at room temperature, will not discolor or alter its optical density by as much as 0.05 optical density units when exposed to sufficient ultraviolet radiation having a majority of the radiation distributed over the range of 350 and 450 nm to enable an image to be developed from activation of the diazo resins and have no ingredients capable of migrating through said barrier layer and desensitizing said diazo resin, discoloring said pigment, or distorting the optical properties of the other layers.

14. The presensitized sheet of claim 13 wherein said acrylic polymer or copolymer comprises poly(n-butyl acrylate), a copolymer of n-butyl acrylate, poly(ethyl acrylate), or a copolymer of ethyl acrylate.

15. The presensitized sheet of claim 11 wherein said thermal adhesive Comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

16. The presensitized sheet of claim 9 wherein said pigment in said first pigment layer comprises particles coated with metal or metal oxide.

17. The presensitized sheet of claim 11 wherein said pigment in said first pigment layer comprises particles coated with metal or metal oxide.

18. The presensitized sheet of claim 12 wherein said pigment in said first pigment layer comprises particles coated with metal or metal oxide.

19. A presensitized color-proofing sheet comprising a carrier sheet having a release surface, a first pigment layer comprising a continuous layer of hydrophobic water-insoluble resinous polymer softenable or partially dissolvable in a solvent developing medium and a pigment which provides a metallic appearance to this first pigment layer, a second pigment layer comprising a continuous color coating of pigmented organophilic hydrophobic water-insoluble resinous polymer softenable and/or partially dissolvable in the same said solvent developing medium, said color coating being in intimate clinging engagement with but not adhesively bonded to said release surface, and a photopolymerizable layer soluble in said solvent developing medium, prior to polymerization but insoluble in said solvent developer after polymerization, said photopolymerizable layer being over said color coating.

20. The sheet of claim 19 wherein over said polymerizable layer is a thermally-laminable adhesive layer.

21. The presensitized sheet of claim 20 wherein there is a barrier layer between the adhesive layer and said photopolymerizable layer.

22. A presensitized color-proofing sheet comprising a carrier sheet having a release surface, a first pigment layer comprising a continuous layer of hydrophobic water-insoluble resinous polymer softenable or partially dissolvable in a solvent developing medium and a pigment which provides a metallic appearance to this first pigment layer, a second pigment layer comprising a continuous color coating of pigmented organophilic hydrophobic water-insoluble resinous polymer softenable and/or partially dissolvable in the same said solvent developing medium, said color coating being in intimate clinging engagement with but not adhesively bonded to said release surface, and either a) a light-sensitive diazo resin soluble in said solvent developing medium directly associated with said color coating, said direct association being at least one of the following:
 (a) the incorporation of said diazo resin in the color coating to form a single layer; and
 (b) the incorporation of said diazo resin in a layer separate but contiguous to the color coating layer, and over a layer containing said diazo resin, a thermally-laminable adhesive layer bonded to said layer containing said diazo resin, or b) a photopolymerizable layer soluble in said solvent development medium prior to polymerization but insoluble in said solvent development medium after photopolymerization, said photopolymerizable layer being over said second pigment layer.

23. The presensitized sheet of claim 22 wherein there is a barrier layer between said photopolymerizable layer and the adhesive layer.

24. A presensitized color-proofing sheet comprising a carrier sheet having a release surface, a first pigment layer comprising a continuous layer of hydrophobic water-insoluble resinous polymer softenable or partially dissolvable in a solvent developing medium and a pigment which provides a metallic appearance to this first pigment layer, a second pigment layer comprising a continuous color coating of non-metallic appearing pigmented organophilic hydrophobic water-insoluble resinous polymer softenable and/or partially dissolvable in the same said solvent developing medium, said first pigment layer being in intimate clinging engagement with but not adhesively bonded to said release surface, and a photosensitive layer which changes its solubility from either soluble to insoluble or insoluble to soluble in said solvent developing medium after photoactivation.

25. The sheet of claim 24 wherein said photosensitive layer is over said color coating.

26. The sheet of claim 24 wherein over said polymerizable layer is a thermally-laminable adhesive layer.

27. The sheet of claim 25 wherein over said polymerizable layer is a thermally-laminable adhesive layer, and a barrier layer is between said polymerizable layer and said thermally laminable adherent layer.

28. The sheet of claim 3 wherein the order of layers within said sheet comprises:
 a) a support layer,
 b) a visible color pigment layer, and
 c) a metallic appearing pigment layer.

29. The sheet of claim 4 wherein the order of layers within said sheet comprises:
 a) a support layer,
 b) a visible color pigment layer, and
 c) a metallic appearing pigment layer.

30. The sheet of claim 6 wherein a barrier layer is in between said adhesive layer and visible color pigment layer.

31. The sheet of claim 30 wherein a release layer is between said support layer and said metallic appearing pigment layer.

32. A presensitized color-proofing sheet comprising a carrier sheet having a first pigment layer comprising a continuous layer of hydrophobic water-insoluble resinous polymer softenable or partially dissolvable in a solvent developing medium and a pigment which provides a metallic appearance to this first pigment layer, a second pigment layer comprising a continuous color coating of pigmented organophilic hydrophobic water-insoluble resinous polymer softenable and/or partially dissolvable in the same said solvent developing medium, the metallic pigment layer being farthest from said carrier sheet, and a light-sensitive diazo resin soluble in said solvent developing medium directly associated with said color coating and adhered to said carrier sheet, said direct association being at least one of the following:
 (a) the incorporation of said diazo resin in the color coating to form a single layer; and
 (b) the incorporation of said diazo resin in a layer separate but contiguous to the color coating layer.

* * * * *